US010892201B2

(12) United States Patent
Lopez et al.

(10) Patent No.: US 10,892,201 B2
(45) Date of Patent: Jan. 12, 2021

(54) ELECTRONIC DEVICE COMPRISING A SUPPORT SUBSTRATE AND AN ENCAPSULATING COVER FOR AN ELECTRONIC COMPONENT

(71) Applicants: STMicroelectroncis (Grenoble 2) SAS, Grenoble (FR); STMicroelectronics (Malta) Ltd, Kirkop (MT)

(72) Inventors: Jerome Lopez, Saint Joseph de Riviere (FR); Roseanne Duca, Ghaxaq (MT)

(73) Assignees: STMicroelectronics (Grenoble 2) SAS, Grenoble (FR); STMicroelectronics (Malta) Ltd, Kirkop (MT)

( * ) Notice: Subject to any disclaimer, the term of this patent is extended or adjusted under 35 U.S.C. 154(b) by 0 days.

(21) Appl. No.: 16/788,627

(22) Filed: Feb. 12, 2020

(65) Prior Publication Data

US 2020/0185288 A1     Jun. 11, 2020

Related U.S. Application Data

(62) Division of application No. 16/133,065, filed on Sep. 17, 2018, now Pat. No. 10,600,704.

(30) Foreign Application Priority Data

Sep. 18, 2017 (FR) ..................... 17 58608

(51) Int. Cl.
*H01L 21/00* (2006.01)
*H01L 23/10* (2006.01)
(Continued)

(52) U.S. Cl.
CPC ............. *H01L 23/10* (2013.01); *H01L 21/50* (2013.01); *H01L 23/3121* (2013.01); *H01L 23/49838* (2013.01)

(58) Field of Classification Search
CPC ......... H01L 21/50; H01L 21/56; H01L 23/10; H01L 23/3121; H01L 23/49838
(Continued)

(56) References Cited

U.S. PATENT DOCUMENTS 5,291,572 A * 3/1994 Blonder ............... G02B 6/4202
257/E23.193
6,448,109 B1 * 9/2002 Karpman ............. B81B 7/0077
156/182

(Continued)

FOREIGN PATENT DOCUMENTS

| EP | 2677538 A1 | 12/2013 |
| JP | 2005310936 A | 11/2005 |
| JP | 2011228352 A | 11/2011 |

OTHER PUBLICATIONS

INPI Search Report and Written Opinion for FR 1758608 dated May 25, 2018 (9 pages).

*Primary Examiner* — Laura M Menz
(74) *Attorney, Agent, or Firm* — Crowe & Dunlevy

(57) ABSTRACT

A support substrate has a face above which at least one electronic component is fixed. A peripheral area of the face includes an annular local metal layer. An encapsulating cover for the electronic component includes a peripheral wall having an end edge that is mounted above the peripheral area. The annular metal local layer includes, at the periphery thereof, a series of spaced-apart teeth with notches formed therebetween. The teeth extend as far as the peripheral edge of the support substrate.

11 Claims, 3 Drawing Sheets

(51) Int. Cl.
*H01L 23/31* (2006.01)
*H01L 21/50* (2006.01)
*H01L 23/498* (2006.01)

(58) Field of Classification Search
USPC .......................................... 438/113, 118, 124
See application file for complete search history.

(56) References Cited

U.S. PATENT DOCUMENTS

| | | | |
|---|---|---|---|
| 6,777,263 B1 * | 8/2004 | Gan | B81C 1/00269 257/417 |
| 10,600,704 B2 * | 3/2020 | Lopez | H01L 23/49838 |
| 2019/0279926 A1 * | 9/2019 | Hsieh | H01L 23/49838 |
| 2020/0185288 A1 * | 6/2020 | Lopez | H01L 23/49838 |

* cited by examiner

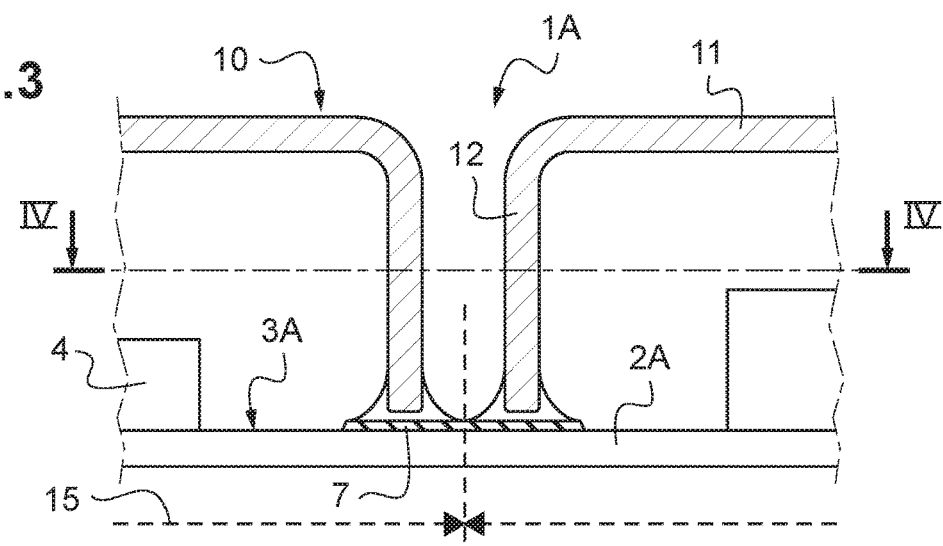
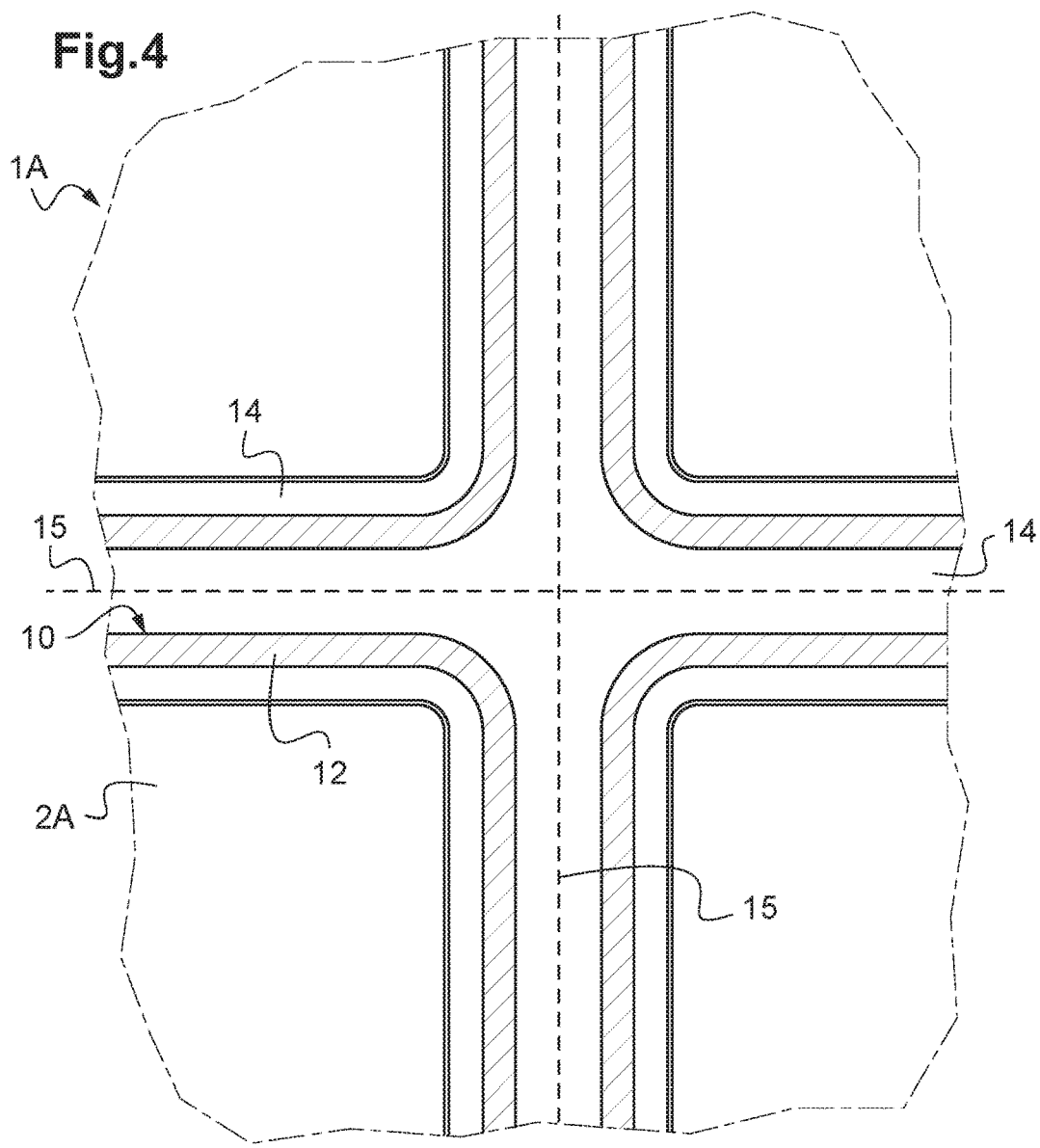

ELECTRONIC DEVICE COMPRISING A SUPPORT SUBSTRATE AND AN ENCAPSULATING COVER FOR AN ELECTRONIC COMPONENT

CROSS REFERENCE TO RELATED APPLICATIONS

This application is a divisional of U.S. patent application Ser. No. 16/133,065 filed Sep. 17, 2018, which claims the priority benefit of French Application for Patent No. 1758608, filed on Sep. 18, 2017, the contents of which are hereby incorporated by reference in their entireties to the maximum extent allowable by law.

TECHNICAL FIELD

Embodiments relate to the field of the electronic devices that comprise support substrates and encapsulating covers for electronic components mounted on the support substrates.

BACKGROUND

When the support substrates are provided with peripheral metal layers above which the encapsulating covers are fixed and when the electronic devices result from collective manufacturing, there are difficulties particularly linked to the delamination of the metal layers during the sawing of the support substrates between the metal covers and through the metal layers. There is also a requirement to reduce the parts of the support substrates extending beyond the encapsulating covers.

SUMMARY

An electronic device is proposed which comprises a support substrate having a face above which at least one electronic component is fixed, and provided on a peripheral area of this face with an annular local metal layer and comprising an encapsulating cover for said electronic component, this encapsulating cover comprising a peripheral wall, an end edge of which is fixed above said peripheral area.

Said annular metal local layer has, at the periphery thereof, a plurality of spaced-apart teeth forming, therebetween, notches, these teeth extending as far as the peripheral edge of the support substrate.

The device can comprise a bonding material between the end edge of the peripheral wall of the encapsulating cover, this bonding material at least partially overlapping said annular local metal layer.

The bonding material can at least partially overlap the teeth of the annular local metal layer.

A collective electronic device is also proposed which comprises a collective support substrate having a face above which electronic components are fixed, in locations, and provided on a peripheral area of each location with an annular metal local layer, and encapsulating covers for said electronic components, at a distance from each other and fixed above said locations, respectively, each encapsulating cover comprising a peripheral wall, an end edge of which is fixed above the peripheral area of the corresponding location.

Each annular local metal layer has a plurality of spaced-apart teeth forming, therebetween, notches, these teeth extending into the spaces between the encapsulating covers.

The teeth are extended into areas for subsequent cutting of the collective support substrate, that are located between the encapsulating covers.

The teeth of the adjacent annular local metal layers can join up.

The teeth of the adjacent annular local metal layers can be at a distance from one another.

The collective electronic device can comprise rings of bonding material between the end edges of the peripheral walls of the encapsulating covers, this bonding material at least partially overlapping the annular local metal layers.

A method of manufacturing a plurality of electronic devices is also proposed, which method comprises the following steps: taking a collective electronic device as defined above and carrying out, between and at a distance from the encapsulating covers, an operation for cutting the collective support substrate and the teeth of said annular local metal layers, such as to obtain a plurality of individual electronic devices.

BRIEF DESCRIPTION OF THE DRAWINGS

Electronic devices and manufacturing modes will now be described as nonlimiting exemplary embodiments, illustrated by the drawing wherein:

FIG. 3 shows a partial cross-section of a collective electronic device;

FIG. 4 shows a flat section, along IV-IV, of the collective electronic device of FIG. 3.

DETAILED DESCRIPTION

Figure 1:
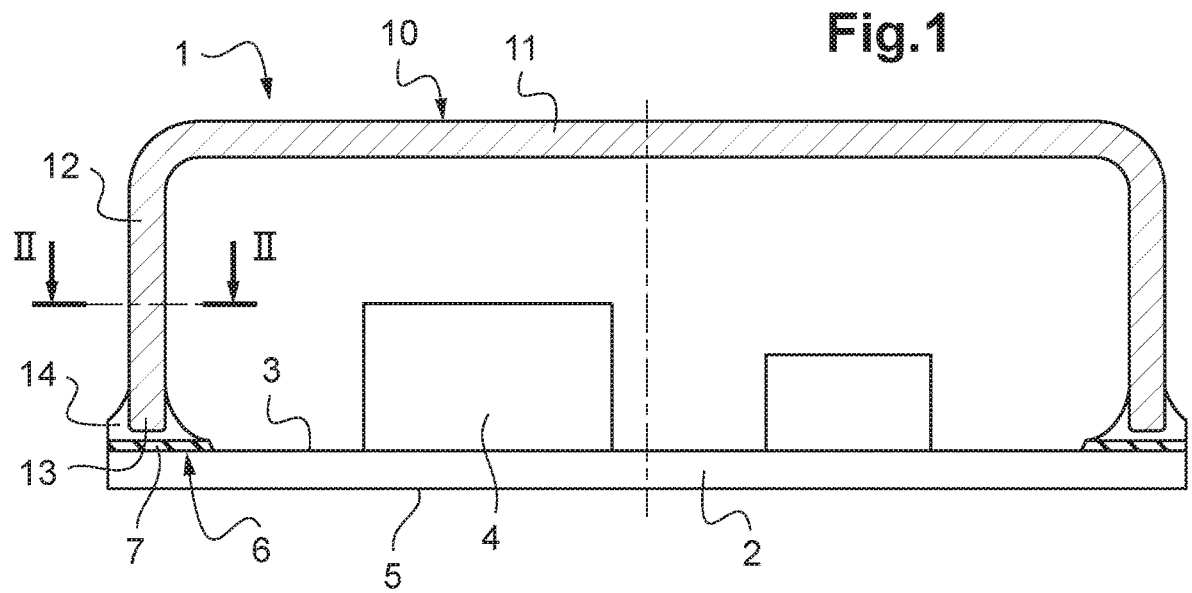
FIG. 1 shows a cross-section of an electronic device.
Figure 2:
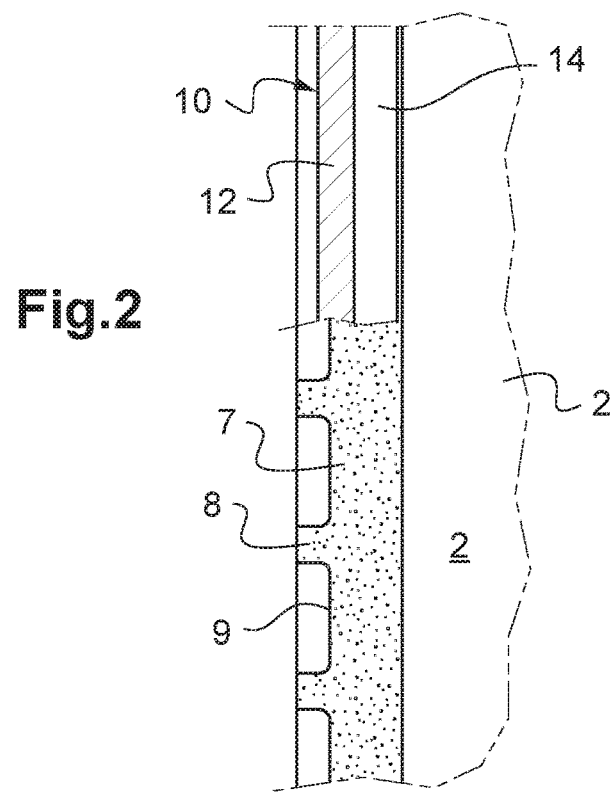
FIG. 2 shows a flat section, along II-II, of the electronic device of FIG. 1.

FIGS. 1 and 2 illustrate an electronic device 1 which comprises a support substrate 2 which is in the form of a plate that is rectangular or square, for example, and which has a front face 3 above which one or more electronic components 4 are fixed.

The support substrate 2, which is made of a dielectric material, is provided with an integrated interconnection network (not shown) in order to produce electrical connections between the front face 3 and a rear face 5 of the support substrate 2. The electronic component or components 4 can be mounted on the front face 3 of the support substrate 2 by means of electric connection elements (which are not shown) linked to said interconnection network or can be stuck to the front face 3 of the support substrate 2 and linked to said interconnection network by means of electric connection wires (which are not shown).

The support substrate 2 is provided, on a peripheral area 6 of the front face 3 thereof, with an annular metal local layer 7.

As illustrated more precisely in FIG. 2, the local metal layer 7 has, at the periphery thereof, a plurality of teeth 8 which are spaced apart and form, therebetween, notches 9, these teeth 8 extending as far as the peripheral edge of the support substrate 2.

The electronic device 1 comprises an encapsulating cover 10 for the electronic component or components 4.

The encapsulating cover 10, in bowl form, comprises a wall 11 which extends in front of the electronic component or components 4, for example parallel to the support substrate 2, and a peripheral lateral wall 12 which extends, for example, perpendicular to the support substrate 2.

The end peripheral edge 13 of the peripheral wall 12 is at a distance from and inside the peripheral edge of the support substrate 2, such that the support substrate 2 has a peripheral part which extends beyond the end peripheral edge 13 of the peripheral wall 12 in the outward direction.

The end peripheral edge 13 of the peripheral wall 12 is fixed above the peripheral area 6 and therefore above at least the local metal layer 7, by means of a bonding material 14.

The teeth 8 and the notches 9 of the local metal layer 7 can be located outside the end peripheral edge 13 of the peripheral wall 12 of the encapsulating cover 10 or can also extend below the end peripheral edge 13 of the peripheral wall 12 of the encapsulating cover 10.

When the encapsulating cover 10 is made from a metal material, the bonding material 14 can be a solder material that attaches to the local metal layer 7 or an adhesive.

When the encapsulating cover 10 is made from a plastic, the bonding material 14 can be an adhesive.

Advantageously, the bonding material 14 extends below and on either side of the end edge 13 of the peripheral wall 12 and extends as far as the peripheral edge of the support substrate 2.

Figure 5:
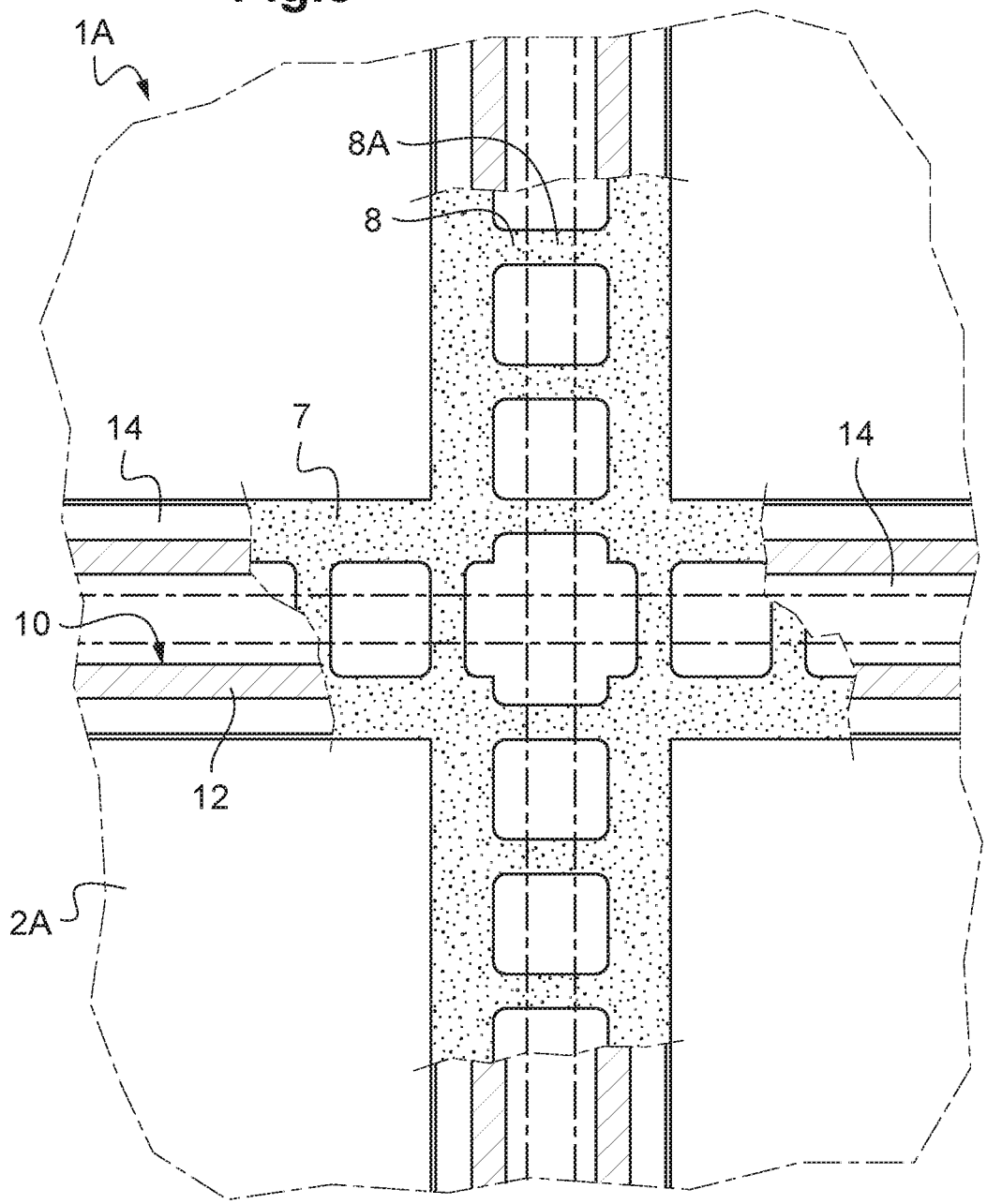
FIG. 5 shows the flat local section of the collective electronic device of FIG. 3, with a partial tear-out of the cover.

As illustrated in FIGS. 3-5, the electronic device 1 can result from collective manufacturing of a collective electronic device 1A, for example as described below.

There is provided a collective support substrate 2A which has locations 15 corresponding substantially to the electronic devices 1 to be obtained. These locations form a rectangular or square mosaic.

In each location 15, the collective support substrate 2A is provided with an electric connection network from one face to the other (which network is not shown).

In each location 15, the collective support substrate 2A is provided with an annular local metal layer 7 which corresponds to the annular local metal layer 7 of each electronic device 1 to be obtained and has a front face 3A above which electronic components 4 are mounted.

As illustrated more precisely in FIG. 5, the teeth 8 of each local metal layer 7 extend into the spaces between the corresponding encapsulating covers 10.

The teeth 8 of the adjacent annular local metal layers 7, which are located facing one another, are extended and join up via portions 8A, respectively, which are distant from one another.

In each location 15, a ring of bonding material 14 has been deposited.

In each location 15, an encapsulating cover 10 as described above has been put in place by squashing the bonding material 14 and the bonding material 14 has been hardened, such that the encapsulating covers are at a distance from one another.

The collective electronic device 1A being produced, cutting perpendicular to the collective substrate 2A is then carried out, for example by sawing, along lines and columns which pass between and at a distance from the adjacent sides of the peripheral lateral walls 12 of the encapsulating covers 10 and between and at a distance from the adjacent legs of the annular local metal layers 7.

Thus, the cutting is produced through the collective substrate 1A and the portions 8A joining the teeth 8 to be obtained, such as to eliminate the portions 8A located in the width or area of the cutting and to only leave the teeth 8, and possibly through the parts outside the encapsulating covers 10 of the bonding material 14.

Thereafter, electronic devices 1 are obtained which correspond to the locations 15, respectively.

During cutting, the cutting tool only meets the metal portions 8A which join the teeth 8, to be obtained, of the annular local metal layers 7, such that, in each obtained electronic device 1, the attachment of the annular local metal layer 7 to the support substrate 2 and the attachment of the bonding material 14 to the annular local metal layer 7 and to the end of the peripheral wall 12 of the encapsulating cover 10 are preserved.

In an alternative embodiment, the teeth 8, to be obtained, of the annular local metal layers 7 could be extended into the width or area of the cutting without joining up, the portions located in the cutting width or area being eliminated during cutting such as to only leave the teeth 8.

The invention claimed is:

1. A method, comprising:
    forming annular metal local layers on a face of a support substrate, the annular metal local layers surrounding locations for receiving and mounting an electronic component;
    forming a plurality of notches in the annular metal local layers to define a plurality of spaced-apart teeth;
    mounting a plurality of encapsulating covers to the support substrate, each encapsulating cover mounted above a corresponding one of the locations with an end edge of a peripheral wall of each encapsulating cover attached to the annular metal local layer; and
    then cutting, between and at a distance from adjacent ones of the encapsulating covers, along the annular metal local layers and through the support substrate and the teeth of said annular local metal layers to obtain a plurality of individual electronic devices.

2. The method of claim 1, wherein forming the plurality of notches comprises forming each notch to be surrounded by portions of the annular metal local layers.

3. The method of claim 1, wherein mounting the plurality of encapsulating covers comprises aligning the end edge of the peripheral wall of each encapsulation cover with the notches.

4. A method, comprising:
    forming an annular metal local layer on a face of a support substrate, the annular metal local layer surrounding a location for receiving and mounting an electronic component;
    forming a plurality of notches in the annular metal local layer;
    mounting an encapsulating cover to the support substrate over said location, wherein said encapsulating cover includes a front wall and a peripheral wall extending from a surface of the front wall, wherein mounting comprises attaching an end edge of said peripheral wall of the encapsulating cover to the annular metal local layer; and
    cutting along said notches and at a distance from an outer peripheral surface of the peripheral wall through the annular metal local layer and the support substrate to define a plurality of teeth in the annular metal local layer that are spaced apart from each other by notches.

5. The method of claim 4, wherein forming the plurality of notches comprises forming each notch to be surrounded by portions of the annular metal local layer.

6. The method of claim 4, wherein mounting the encapsulating cover comprises aligning the end edge of the peripheral wall with the notches.

7. The method of claim 1, wherein each encapsulating cover includes a front wall and said peripheral wall extending from a surface of the front wall.

8. A method, comprising:
   forming annular metal local layers on a face of a support substrate, the annular metal local layers surrounding locations for receiving and mounting an electronic component;
   with respect to each portion of the annular metal local layers positioned between adjacent locations, forming in said portion a plurality of notches to define a plurality of spaced-apart teeth;
   mounting a plurality of encapsulating covers to the support substrate, each encapsulating cover mounted above a corresponding one of the locations with an end edge of a peripheral wall of each encapsulating cover attached to the annular metal local layer; and
   then cutting, between and at a distance from adjacent ones of the encapsulating covers, along the annular metal local layers and through the support substrate and the teeth of said annular local metal layers to obtain a plurality of individual electronic devices.

9. The method of claim 8, wherein forming the plurality of notches comprises forming each notch to be surrounded by metal of said portion of the annular metal local layers.

10. The method of claim 8, wherein mounting the plurality of encapsulating covers comprises aligning the end edge of the peripheral wall of each encapsulation cover with the notches.

11. The method of claim 8, wherein each encapsulating cover includes a front wall and said peripheral wall extending from a surface of the front wall.

\* \* \* \* \*